United States Patent
Apelsmeier

(10) Patent No.: US 11,296,686 B2
(45) Date of Patent: Apr. 5, 2022

(54) METHOD FOR OPERATING AN ELECTRICAL CIRCUIT, ELECTRICAL CIRCUIT, AND MOTOR VEHICLE

(71) Applicant: AUDI AG, Ingolstadt (DE)

(72) Inventor: Andreas Apelsmeier, Pollenfeld (DE)

(73) Assignee: AUDI AG, Ingolstadt (DE)

(*) Notice: Subject to any disclaimer, the term of this patent is extended or adjusted under 35 U.S.C. 154(b) by 85 days.

(21) Appl. No.: 16/885,784

(22) Filed: May 28, 2020

(65) Prior Publication Data
US 2020/0389163 A1    Dec. 10, 2020

(30) Foreign Application Priority Data
Jun. 4, 2019 (DE) .......................... 102019208122.3

(51) Int. Cl.
*H03K 17/0412* (2006.01)
*B60L 15/00* (2006.01)

(52) U.S. Cl.
CPC ...... *H03K 17/04123* (2013.01); *B60L 15/007* (2013.01); *B60L 2210/42* (2013.01)

(58) Field of Classification Search
CPC ........... H03K 17/04123; B60L 15/0007; B60L 2210/42
See application file for complete search history.

(56) References Cited

U.S. PATENT DOCUMENTS

| | | | | |
|---|---|---|---|---|
| 5,369,316 A | * | 11/1994 | Chen | G11C 11/419 327/108 |
| 10,642,306 B1 | * | 5/2020 | Shankar | H02H 7/1213 |
| 10,771,049 B1 | * | 9/2020 | Bhattad | H02M 1/08 |
| 10,819,351 B1 | * | 10/2020 | Shankar | H03L 7/0895 |

(Continued)

FOREIGN PATENT DOCUMENTS

| | | | | |
|---|---|---|---|---|
| CN | 113783424 A | * | 12/2021 | ............ H02M 1/083 |
| DE | 10 2013 214 224 A1 | | 1/2014 | |

(Continued)

OTHER PUBLICATIONS

German Examination Report dated Jan. 20, 2020 in corresponding German Application No. 10 2019 208 122.3; 24 pages; Machine translation attached.

(Continued)

*Primary Examiner* — Adam D Houston
(74) *Attorney, Agent, or Firm* — Maier & Maier, PLLC

(57) ABSTRACT

A method for operating an electrical circuit including at least one half-bridge formed from two transistors wherein the electrical circuit is switched over between a first switching state, in which the first transistor of the half-bridge is switched to conductive by a first voltage value of a first control voltage and the second transistor of the half-bridge is switched to blocking by a second voltage value of a second control voltage, and a second switching state, in which the first transistor is switched to blocking by a second voltage value of the first control voltage and the second transistor is switched to conductive by a first voltage value of the second control voltage, wherein a dead time state, in which both transistors are switched to blocking, is assumed chronologically between the first switching state and the second switching state.

13 Claims, 5 Drawing Sheets

(56) References Cited

U.S. PATENT DOCUMENTS

| | | | |
|---|---|---|---|
| 2003/0137853 A1* | 7/2003 | Zaitsu | H02M 3/33592 363/25 |
| 2007/0241720 A1* | 10/2007 | Sakamoto | H02P 27/08 318/811 |
| 2008/0284482 A1* | 11/2008 | Ishikawa | H02M 7/538 257/E29.068 |
| 2009/0244936 A1* | 10/2009 | Falk | H02M 7/487 363/40 |
| 2011/0062934 A1* | 3/2011 | Wolf | H02M 7/48 323/304 |
| 2011/0170323 A1* | 7/2011 | Fulcher | H02M 7/53875 363/65 |
| 2011/0309874 A1* | 12/2011 | Takimoto | H03K 17/0814 327/427 |
| 2012/0032657 A1* | 2/2012 | Dequina | H02M 1/38 327/109 |
| 2012/0206170 A1* | 8/2012 | Kimura | H03K 17/04123 327/109 |
| 2012/0206171 A1* | 8/2012 | Kimura | H03K 17/691 327/109 |
| 2013/0162322 A1* | 6/2013 | Tao | H03K 17/04123 327/423 |
| 2014/0021932 A1 | 1/2014 | Ejury | |
| 2014/0159481 A1* | 6/2014 | Berger | B60L 50/51 363/163 |
| 2015/0137857 A1* | 5/2015 | Kusama | H02M 3/158 327/109 |
| 2015/0138858 A1* | 5/2015 | Kusama | H02M 7/537 327/109 |
| 2015/0256089 A1* | 9/2015 | Yamada | H02M 3/3376 363/17 |
| 2015/0311779 A1* | 10/2015 | Hayashiguchi | H03K 17/163 363/56.01 |
| 2015/0372611 A1* | 12/2015 | Hiller | H02M 7/48 363/163 |
| 2016/0211743 A1* | 7/2016 | Harrison | H02J 3/1835 |
| 2016/0218612 A1* | 7/2016 | Morimoto | H02M 7/5387 |
| 2017/0302152 A1* | 10/2017 | Watanabe | H03K 17/04123 |
| 2018/0226966 A1* | 8/2018 | Apelsmeier | H01L 29/2003 |
| 2018/0309440 A1* | 10/2018 | Bhat | H01L 29/1608 |
| 2018/0369864 A1* | 12/2018 | Lei | G01N 29/225 |
| 2019/0036520 A1* | 1/2019 | Luo | H03K 17/04123 |
| 2019/0092175 A1* | 3/2019 | Sainsaulieu | H05K 7/20945 |
| 2019/0097563 A1* | 3/2019 | Shimomugi | F25B 31/02 |
| 2019/0173529 A1* | 6/2019 | Garcia | H02J 50/10 |
| 2019/0238062 A1* | 8/2019 | Lu | H03K 17/602 |
| 2019/0267212 A1* | 8/2019 | Mavretic | H01L 29/861 |
| 2019/0319531 A1 | 10/2019 | Marz et al. | |
| 2019/0393785 A1* | 12/2019 | Pao | H02M 3/158 |
| 2020/0304108 A1* | 9/2020 | Bondar | H03F 3/2173 |
| 2020/0321959 A1* | 10/2020 | Bhat | H01L 29/1608 |
| 2020/0381989 A1* | 12/2020 | Kuang | H02M 1/0006 |
| 2020/0389163 A1* | 12/2020 | Apelsmeier | H03K 17/166 |
| 2020/0412235 A1* | 12/2020 | Chivite-Zabalza | H02M 1/32 |
| 2021/0013792 A1* | 1/2021 | Matsubara | H03K 17/165 |
| 2021/0036696 A1* | 2/2021 | Pham | H03K 17/0406 |
| 2021/0143676 A1* | 5/2021 | Nakao | H04B 5/0075 |
| 2021/0204367 A1* | 7/2021 | Lee | H05B 6/062 |
| 2021/0211067 A1* | 7/2021 | Kumar | B60L 50/60 |
| 2021/0242796 A1* | 8/2021 | Uemura | F24F 11/88 |

FOREIGN PATENT DOCUMENTS

| | | | | |
|---|---|---|---|---|
| DE | 102013107379 A1 | 1/2014 | | |
| DE | 102013219475 A1 | 4/2014 | | |
| DE | 102016223312 A1 | 5/2018 | | |
| DE | 102017128986 A1 | 6/2018 | | |
| EP | 3316463 A1 | 5/2018 | | |
| EP | 3748827 A1 * | 12/2020 | | B60L 15/007 |
| WO | 2006/037670 A1 | 4/2006 | | |
| WO | WO-2017137092 A1 * | 8/2017 | | H02M 7/483 |

OTHER PUBLICATIONS

Zhang et al., "An improved gate driver based on magnetic coupling for cross talk suppression of SiC devices", IEE 3rd International Future Energy Electronics Conference and ECCE Asia, Jun. 3, 2017, pp. 422-427.

Marz et al., "Comparison of SiC MOSFET gate-drive concepts to suppress parasitic turn-on in low inductance power modules", 19th European Conference on Power Electronics and Applications, Sep. 11, 2017, pp. 1-10.

Search Report dated Oct. 19, 2020 in corresponding European Application No. 20 17 5138; 13 pages including partial machine-generated English-language translation.

* cited by examiner

METHOD FOR OPERATING AN ELECTRICAL CIRCUIT, ELECTRICAL CIRCUIT, AND MOTOR VEHICLE

FIELD

The disclosure relates to a method for operating an electrical circuit including at least one half-bridge formed from two transistors, wherein the electrical circuit is switched over between a first switching state, in which the first transistor of the half-bridge is switched to conductive by a first voltage value of a first control voltage and the second transistor of the half-bridge is switched to blocking by a second voltage value of a second control voltage, and a second switching state, in which the first transistor is switched to blocking by a second voltage value of the first control voltage and the second transistor is switched to conductive by a first voltage value of the second control voltage, wherein a dead time state, in which both transistors are switched to blocking, is assumed chronologically between the first switching state and the second switching state.

BACKGROUND

Electrical circuits which comprise at least one half-bridge made of two transistors are used in many fields of technology. For example, such circuits can be used in the form of semiconductor power modules in a motor vehicle, for example, as an inverter. This inverter can be used, for example, as a traction inverter for operating an electric motor via a battery. Further possible applications of such circuits in motor vehicles can be, in the 12V range, the steering or the transmission control. A use in electrical air-conditioning compressors or DC-DC converters is also known.

In this case, activation circuits are used to switch the transistors of the half-bridge, via which the transistors can be switched over between a blocking state and a conductive state. Switching losses, which make up a significant proportion of the total power loss of the electrical circuit, result due to the switching of the transistors. The activation of the transistors, which can be, for example MOSFETs or IGBTs, is generally performed by means of separate, galvanically isolated drivers for each of the transistors. Various methods for operating electrical switch arrangements having transistors and/or half-bridges are known from the prior art.

A circuit arrangement for activating a piezoelectric actuator using a DC-DC converter powered by a vehicle electrical system voltage of a motor vehicle is described in WO 2006/037 670 A1. In this case, a high-side switching transistor and a low-side switching transistor are switched via a driver circuit by means of a control signal. The switching transistors are operated inversely in relation to one another for the activation of the piezoelectric actuator, so that they are alternately switched to conductive.

DE 10 2013 219 475 A1 describes an electronic circuit having an electronic switch and a monitoring circuit. In this case, the monitoring circuit is designed as a switched capacitor circuit having at least one capacitive storage element and is connected to a load section of the electronic switch. The monitoring circuit is operated here in such a way that it evaluates a load voltage of the electronic switch and a counter signal can be generated in dependence on the evaluation. The driver circuit of the electric switch is operated in such a way that the driver signal provided at a control terminal of the electronic switch is generated in dependence on the counter signal.

A bridge circuit made of integrated semiconductor components is known from DE 10 2013 107 379 A1. The bridge circuit in this case comprises a first integrated semiconductor component as a high-side switch and a second integrated semiconductor component as a low-side switch, which is electrically connected to the high-side switch. A level converter is provided here for each semiconductor component, wherein the level converters are each integrated into one of the semiconductor components. The semiconductor components are connected via the level converters to a driver, via which the semiconductor components are switched.

DE 10 2016 223 312 A1 describes a power semiconductor assembly for a motor vehicle and a method for operating this power semiconductor assembly. The power semiconductor assembly comprises a transistor and a driver unit, via which a chronological switching voltage profile is provided between a gate terminal of the transistor and its source terminal or emitter terminal for the switching. The DC voltage profile comprises in this case a switching-on pulse, which immediately precedes the switching-on phase of the transistor and the voltage of which is greater than the switching-on voltage, and/or a switching-off pulse, which immediately follows the switching-on phase and the voltage of which is less than the switching-off voltage.

SUMMARY

The disclosure is based on the object of specifying a method for operating an electrical circuit comprising a half-bridge formed from two transistors, which reduces the switching losses in operation of the electrical circuit.

To achieve this object, it is provided according to the invention in a method of the type mentioned at the outset that in the dead time state, the control voltage of at least one of the transistors is set to an intermediate voltage value, which is between the first voltage value and the second voltage value of the control voltage of the transistor.

The half-bridge comprises two transistors electrically connected to one another. For example, if field-effect transistors are used, the source contact of the first transistor is connected to the drain contact of the second transistor in this case. By switching the transistors between the first switching state and the second switching state, a switching node between the two transistors, which can also be referred to as a bridge point or center point of the half-bridge, can be changed in its potential. If two field-effect transistors are used, in this case, for example, in the first switching state, the bridge point can be set to a first potential applied at the drain contact of the first transistor, in that the first transistor is switched to conductive and the second transistor is switched to blocking. Vice versa, the bridge point can also be set in the second switching state to a second potential applied at the source contact of the second transistor, in that the second transistor is switched to conductive and the first transistor is switched to blocking.

Between the first switching state, in which the first transistor is switched to conductive and the second transistor is switched to blocking, and the second switching state, in which the first transistor is switched to blocking and the second transistor is switched to conductive, a dead time state is provided, in which both transistors are switched to blocking. Such a dead time state serves to protect the operation of the half-bridge and/or the electrical circuit, since an undesired state in which both the first transistor and also the second transistor are switched to conductive can be efficiently avoided in this manner. The first switching state and the second switching state can in particular be assumed alternately, wherein a dead time state is provided in each case between the switching states.

The switching or the control of the first transistor is performed by the first control voltage, wherein at a first voltage value of the first control voltage, the first transistor is switched to conductive and at a second voltage value of the first control voltage, the first transistor is switched to blocking. If a field-effect transistor is used, the control voltage can correspond to the gate-source voltage, wherein the first voltage value corresponds to a forward voltage, at which the first transistor or the drain-source section of the first transistor is conductive, and the second voltage value accordingly corresponds to a reverse voltage, at which the first transistor or the drain-source section of the first transistor is not conductive. This also applies accordingly to the second transistor, which is switched or controlled by the second voltage. The first voltage value of the first control voltage can be equal to the first voltage value of the second control voltage and/or the second voltage value of the first control voltage can be equal to the second voltage value of the second control voltage.

By setting the control voltage of at least one of the transistors in the dead time state to an intermediate voltage value, which is between the first voltage value and the second voltage value of the respective control voltage, it can be achieved that in a switching state following the dead time state, in which one of the two transistors is switched to conductive, it has an increased slope during the switching procedure, i.e., a faster change of the current during the switching procedure. This increased slope of the transistor switched to conductive is to be attributed here to the control voltage, which is set to the intermediate voltage value in the dead time state, of the other transistor, which is switched to nonconductive, i.e., is operated in a blocking manner. Therefore, due to the change of the control voltage in the dead time state of the transistor switched to nonconductive in the following state, the switching characteristic of the transistor then switched to conductive can be improved. This improved switching characteristic can be attributed to a change of the commutation properties of an intrinsic diode of the non-switched transistor. These commutation properties are dependent on the control voltage applied at the transistor. During the switching of the transistors, a current transfer takes place faster with a higher control voltage at the transistor switched to nonconductive than with a lower control voltage. During a normal switching procedure of a half-bridge, the current commutates, for example, from a first transistor representing a high-side transistor to the diode of the second transistor representing a low-side transistor or vice versa. Therefore, due to the variable commutation properties, influence can be taken on the switching procedure of the switched transistor by the control voltage of the respective non-switched transistor.

An increased slope during the switching of the transistor causes a reduction of the switching losses during the switching procedure. The switching losses generally contribute in a proportion between 20% and 50% to the total losses during the operation of a half-bridge. By reducing the switching losses, for example, the waste heat of the circuit can be reduced, whereby the cooling effort and/or the area required for cooling of transistors implemented as semiconductor components can be reduced. Furthermore, in a motor vehicle comprising the electrical circuit, a range in electric driving mode can be increased and/or the battery capacity required for achieving a range can be reduced due to the reduced switching losses.

The intermediate voltage value, to which the control voltage of the at least one transistor is set, is between the first voltage value, which corresponds to a forward voltage of the transistor, and a second voltage value, which corresponds to a reverse voltage of the transistor. The intermediate voltage value is selected here in such a way that the transistor still blocks. This can be achieved, for example, in that a value which is significantly below a threshold voltage of the transistor is selected for the second value of the control voltage. A value can then be taken as the intermediate voltage value which is greater than the second voltage value, but is still less than the threshold voltage of the transistor, so that conductivity switching of the transistor does not take place due to the setting of the control voltage to the intermediate voltage value. For example, it can be provided that the first voltage value of the control voltage of a transistor is selected to be +15 V, the second voltage value of the control voltage is selected to be −4 V, and a value of −1 V, 0 V, or 1 V is selected as the intermediate voltage. These values are to be understood as examples and are oriented according to the characteristics of the respective transistor used. It is possible that different or identical transistors are used for the two transistors of the at least one half-bridge of the electrical circuit. Both transistors can also correspond to the same type, for example, an nMOS-Typ or a pMOS-Typ, or can be different types, in particular complementary types of transistors, for example, CMOS transistors.

It can be provided according to the invention that in the dead time state, the control voltage of both transistors is set in each case to an intermediate voltage value, which is between the first voltage value and the second voltage value of the control voltage of the respective transistor. In particular, the same intermediate voltage value of the respective control voltage can be used for both transistors in this case. Because the control voltage of both transistors is set to the intermediate voltage value, independently of which of the two transistors is switched to conductive in the following switching state, the still blocking transistor is switched using the intermediate voltage value of the control voltage. Furthermore, the switching-off procedure of the respective current-conducting transistor can be performed with a greater slope if the other transistor of the half-bridge is activated using a control voltage at the level of the intermediate voltage value.

In one preferred design of the invention, it can be provided that it is selected in dependence on a predetermined or measured current direction of a load current flowing at the center point of the half-bridge at which of the transistors the control voltage is set in the dead time state to the intermediate voltage value. In this embodiment of the method according to the invention, the control voltage is only set to the intermediate voltage value at one of the two transistors in the dead time state. This has the advantage that the other transistor can always be switched using the full voltage range, i.e., using the full difference between the first voltage value and the second voltage value of the control voltage. This switching using the full voltage range increases the switching speed of the transistor and can therefore be used, for example, to reduce the occurring switching losses in the respective transistor conducting current in dependence on the current direction of the load current.

The current direction refers to the technical current direction of the load current, which flows from the center point or the bridge point of the half-bridge to a load connected to this center point. The current direction can be dependent, on the one hand, between which potentials the first and the second transistor, therefore the half-bridge, is arranged and which type of load is powered using the load current. In the case of the load powered via the load current, it is possible in particular that it comprises an inductance, as is the case, for example, in stator windings of an electric machine. It is also possible that a load current having inverted sign occurs if the load can also be used for generating current. This can be the case, for example, in a three-phase electric motor activated via the electrical circuit comprising at least one half-bridge, since an alternating current can be generated via the electric motor in a generator mode and can be rectified via the electrical circuit into a direct current. In this case, it can be provided in particular that the electrical circuit comprises more than one half-bridge for operating the three-phase electric motor and/or for the rectification. Additionally or alternatively, for example, a so-called synchronous rectification of an electrical circuit operated as a bidirectional inverter can be implemented, in which a negative load current generated by the load is conducted by the conductively switched channel of one of the transistors instead of via the intrinsic diode of a transistor. It can be provided that during this synchronous rectification, a different duration of the dead time state is set than between the first switching state and the second switching state.

According to the invention, it can be provided that the first transistor is connected to a first potential and the second transistor is connected to a second potential lying below the first potential, wherein upon positive current direction of the load current in relation to the center point of the half-bridge, in the dead time state, the voltage value of the second control voltage is set to the intermediate voltage value and/or upon negative current direction of the load current in relation to the center point of the half-bridge, in the dead time state, the voltage value of the first control voltage is set to the intermediate voltage value. In this arrangement, the first transistor represents a high-side transistor, in which, for example, a drain contact is connected to the first potential. The first potential can represent a positive potential, for example, of a battery or the like. The source contact of the first transistor is connected in this case, as described at the outset, to the center point of the half-bridge and from there, for example, to a drain contact of the second transistor, which represents a low-side transistor. The source contact of the second transistor is connected here to the second potential, which is lower than the first potential. The second potential can be, for example, a negative battery potential or a ground potential of the electrical circuit. By setting the second control voltage of the low-side transistor to the intermediate voltage value upon the presence of a positive current direction of the load current in relation to the center point of the half-bridge and/or upon the corresponding setting of the first control voltage of the first transistor to the intermediate voltage value upon the presence of a negative current direction of the load current in relation to the center point of the half-bridge, during an operation of the load via the load current, the respective current-conducting transistor can be operated using maximum voltage range. The switching losses of the electrical circuit are thus advantageously reduced.

In a generator mode of the load, i.e., when a current is generated by the load itself, an inverted mode can be provided, in which upon positive current direction of the load current in relation to the center point of the half-bridge, in the dead time state, the voltage value of the first control voltage is set to the intermediate voltage value and/or upon negative current direction of the load current in relation to the center point of the half-bridge, in the dead time state, the voltage value of the second control voltage is set to the intermediate voltage value. Also in this case, the at least one half-bridge of the electrical circuit is operated in such a way that in the respective non-current-conducting transistor, the control voltage is set to the intermediate voltage value, so that the respective current-conducting transistor is operated using maximum voltage range. It is possible that during the activation of the transistors of the half-bridge, a differentiation is made between a charging mode, or generator mode of the load, and a discharging mode, or a motor mode of the load, wherein the activation respectively takes place as described above.

In general, the consideration of the current direction takes place in such a way that in the respective non-current-conducting transistor, the control voltage is set to the intermediate voltage value, so that the respective current-conducting transistor is operated using maximum voltage range and the switching losses can thus advantageously be reduced.

It can be provided according to the invention that the current direction of the load current is determined by a current sensor of the electrical circuit and/or from at least one semiconductor sensor associated with at least one of the transistors and/or with the aid of a model stored in a processing unit of the electrical circuit. The current sensor for measuring the current direction of the load current can be connected, for example, between the center point of the half-bridge and a load powered using the load current. Additionally or alternatively thereto, it is possible to determine a current direction of the load current by means of a semiconductor sensor, which is associated with at least one of the transistors. The switching behavior of the transistor can be determined and/or evaluated by this semiconductor sensor, for example. The semiconductor sensor can itself be part of a driver circuit associated with the transistor. It is also possible that the current direction is determined by means of a model stored in a processing unit of the electrical circuit. The processing unit can in this case read out various parameters of the electrical circuit and ascertain a current direction with the aid of a model stored in a storage unit of the processing unit.

According to the invention, it can be provided that an electrical circuit having at least one control unit is used, wherein the control unit is designed to generate the first control voltage and/or the second control voltage. It is possible, for example, that one control unit is provided for each of the two transistors of the at least one half-bridge. It is also possible that one control unit is also used for each of further transistors, which form further half-bridges, for example. It is also possible that one control unit is designed for generating the first control voltage and the second control voltage and/or possibly further control voltages of further transistors.

The first control voltage and second control voltage applied to the first transistor and to the second transistor can each be set at least to the first voltage value, the second voltage value, and the intermediate voltage value by the at least one control unit. The control unit can also be referred to as a driver circuit of the transistor or the transistors, respectively. The at least one control unit can be connected to a current sensor and/or the at least one semiconductor sensor or may comprise these sensors for the current-direction-dependent activation of the transistors. It is also possible that the control unit comprises a processing unit or is connected thereto, so that an activation of the transistors on the basis of a model stored in the processing unit is enabled.

In one preferred design of the invention, it can be provided that field-effect transistors, in particular MOSFETs made of silicon carbide, are used as the transistors. In addition to MOSFETs, other types of field-effect transistors such as junction field-effect transistors or the like can be used as field-effect transistors in this case. Upon the use of field-effect transistors as the first transistor and as the second transistor of the at least one half-bridge, the greatest reduction of switching losses can be achieved due to the intrinsic diode formed in this transistor type. The use of transistors made of silicon carbide enables higher switching speeds of the transistors and thus also of the half-bridge and/or the electrical circuit, so that the method according to the invention can be used particularly advantageously.

It can be provided according to the invention that an inverter, which is in particular three-phase and in particular is bidirectionally operable, is used as the electrical circuit. It is also possible that the electrical circuit is a full-bridge, in particular a full-bridge in a DC-DC converter. It is possible that the electrical circuit is designed as a three-phase pulse-controlled inverter. A design of the circuit as a one-phase, two-phase, or more than three-phase inverter is also possible. If multiple half-bridges are present in the electrical circuit, in particular each of the half-bridges can be operated using the method according to the invention. Switching over of the first switching state and the second switching state of the electrical circuit can take place, for example, at a frequency between 5 kHz and 30 kHz, in particular between 10 kHz and 20 kHz.

For an electrical circuit according to the invention, it is provided that it comprises at least one half-bridge formed from two transistors and also at least one control unit, wherein the control unit is designed for operating the electrical circuit. The control unit can be designed in this case in particular as a driver circuit of the transistors of the at least one half-bridge or can comprise such a driver circuit and/or can be connected to such a circuit, so that setting of the first control voltage and the second control voltage is possible via the control unit.

All advantages and features described above with reference to the method according to the invention apply accordingly to the electrical circuit according to the invention.

For a motor vehicle according to the invention, it is provided that it comprises an electrical circuit according to the invention. The electrical circuit can represent in this case, for example, a traction inverter, via which a direct current provided by a battery is converted into an alternating current, in particular a three-phase alternating current, for operating an electric machine of the motor vehicle. The inverter can also operate as a rectifier in this case in a bidirectional mode and can convert an alternating current generated by the electric machine in a generator mode into a direct current for recharging the battery. It is also possible that the electrical circuit is an inverter of the motor vehicle, powered from a 12V vehicle electrical system, a component of an electrical air-conditioning compressor, or a DC-DC converter.

All advantages and details described with reference to the electrical circuit according to the invention and/or the electric method according to the invention also apply accordingly for the motor vehicle according to the invention.

BRIEF DESCRIPTION OF THE DRAWINGS

Further advantages and details of the invention result from the exemplary embodiments illustrated hereafter and on the basis of the drawings. In the schematic illustrations of the figures.

DETAILED DESCRIPTION

Figure 1:
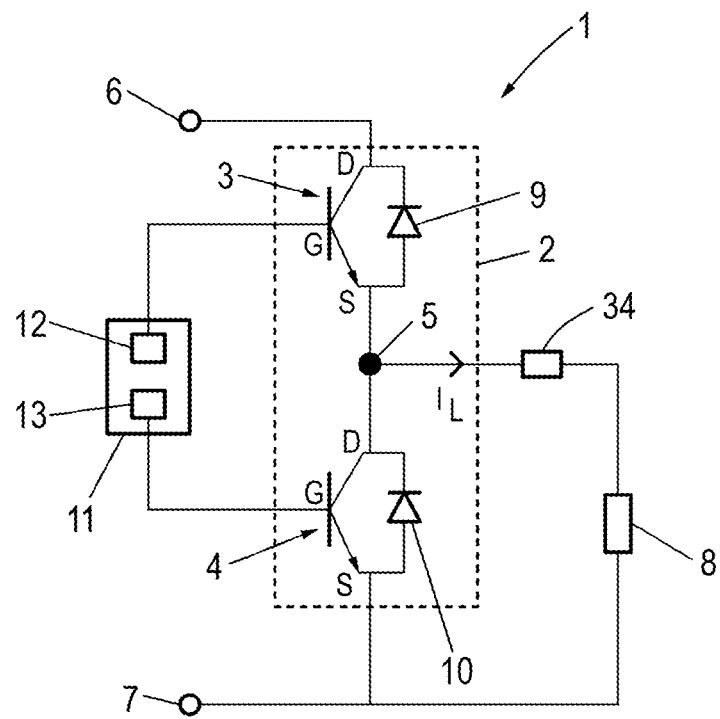
FIG. 1 shows an exemplary embodiment of the circuit arrangement according to the invention

A schematic illustration of an electrical circuit 1 according to the invention is shown in FIG. 1. The electrical circuit 1 comprises a half-bridge 2, which is formed by a first transistor 3 and a second transistor 4. The first transistor 3 represents the high-side transistor of the half-bridge 2 and the second transistor 4 represents the low-side transistor of the half-bridge 2 in this case.

The first transistor 3 and the second transistor 4 are designed, for example, as MOSFET transistors based on silicon carbide. The first transistor 3 is connected to the second transistor 4 via a center point 5 of the half-bridge 2, which can also be referred to as a bridge point. In this case, the source contact of the first transistor 3 is connected to the center point 5 of the half-bridge 2 and the drain contact of the second transistor 4. The drain contact of the first transistor 3 is connected to a first potential 6. The source contact of the second transistor 4 is connected to a second potential 7, which is lower than the first potential 6. The first potential 6 can be a positive potential and the second potential 7 can be a ground potential, for example. A load 8, represented here by a load resistance RL, is connected between the center point 5 of the half-bridge 2 and the second potential 7. The load 8 can also comprise an inductance and/or a capacitance additionally or alternatively to an electrical resistance. The electrical circuit 1 comprises a current sensor 34, via which the direction of a load current IL flowing between the center point 5 and the load 8 can be determined.

The first transistor 3 and the second transistor for each comprise an intrinsic diode 9 or 10, respectively. Furthermore, the first transistor 3 and the second transistor 4 are connected to a control unit 11 of the electrical circuit 1. The control unit 11 comprises two galvanically isolated driver circuits 12, 13, wherein the driver circuit 12 is connected to the gate terminal of the first transistor 3 and the driver circuit 13 is connected to the gate terminal of the second transistor 4. Via the driver circuit 12, a first control voltage is generated, which is used as the gate-source voltage $V_{GS1}$ of the first transistor 3 for the blocking or the switching to conductive, respectively, of the first transistor 3. Accordingly, the driver circuit 13 generates a gate-source voltage $V_{GS2}$ of the second transistor 4, which is used for the blocking or for the switching to conductive, respectively, of the second transistor 4. The control unit 11 is configured for operating the first transistor 3 and the second transistor 4 according to FIG. 4, FIG. 7, and/or FIG. 8.

Figure 2:
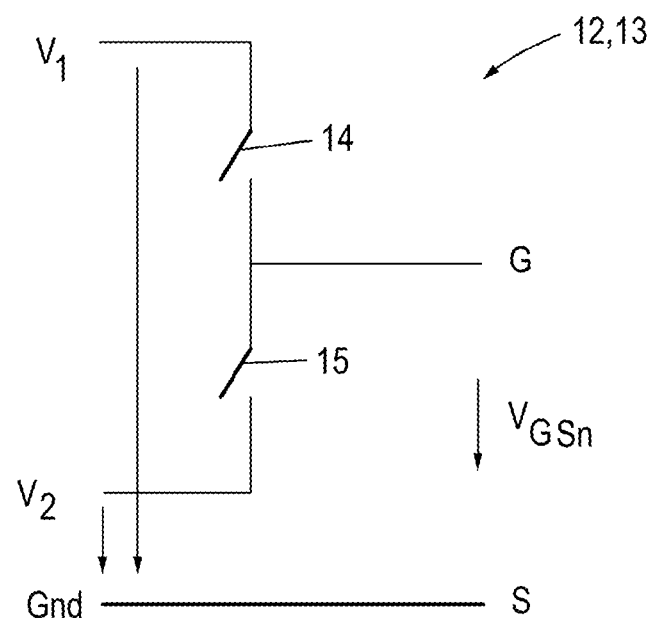
FIG. 2 shows a schematic illustration of a driver circuit of a transistor according to the prior art.
Figure 3:
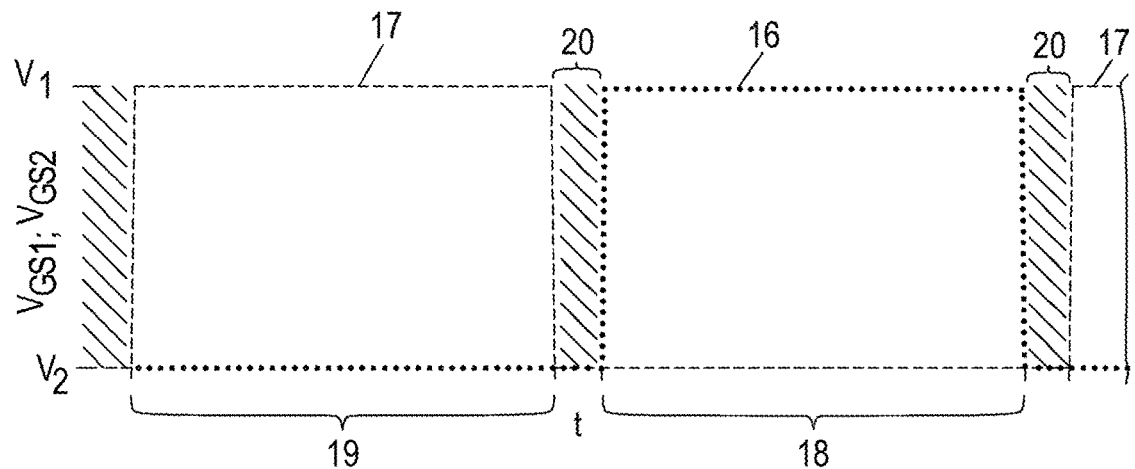
FIG. 3 shows a diagram which shows voltage profiles upon the activation of a half-bridge according to the prior art.

A schematic illustration of a driver circuit 12, 13 according to the prior art is illustrated in FIG. 2. The driver circuit comprises two switches 14, 15 here, by means of which the gate-source voltage $V_{GSn}$ applied at the gate terminal of the transistor connected to the driver circuit 12, 13 can be switched to a first voltage value $V_1$ or a second voltage value $V_2$. In this case, the first voltage value $V_1$ represents a forward voltage, upon which the respective transistor connected to the driver circuit 12, 13 is switched to conductive. The second voltage value $V_2$ represents a reverse voltage, using which the transistor connected to the driver circuit 12, 13 can be blocked. By means of two such driver circuits 12, 13, the half-bridge 2 shown in FIG. 1 could be operated in a manner known from the prior art. FIG. 3 shows this operation.

In FIG. 3, the gate-source voltage $V_{GS1}$ of the first transistor 3 is shown as the first curve 16 and the gate-source voltage $V_{GS2}$ of the second transistor 4 is shown as the second curve 17, each plotted over time. In this case, it is possible to differentiate between a first switching state, in which the first transistor 3 is switched to conductive and the second transistor 4 is switched to blocking, and a second switching state, in which the second transistor 4 is switched to conductive and the first transistor 3 is switched to blocking. The first switching state exists in the illustration in FIG. 3 in a region 18 and the second switching state exists in a region 19. In this case, the first switching state and the second switching state can alternate in the time curve, for example.

Between the first switching state and the second switching state, a dead time state located in the shaded region 20 is provided, in which both the first transistor 3 and also the second transistor 4 are switched to blocking. This dead time state serves to protect the electrical circuit, since an undesired operating state, in which both transistors are switched to conductive, can be effectively avoided in this manner. It is apparent that the first transistor 3 or the second transistor 4 is switched to conductive in that the respective gate-source voltage of the transistor $V_{GS1}$ or $V_{GS2}$, respectively, is switched over from the second voltage value $V_2$ to the first voltage value $V_1$. In the present example shown, the first voltage value $V_1$ is a positive voltage value and the second voltage value $V_2$ is a negative voltage value, i.e., a voltage value lying below a ground potential.

Figure 4:
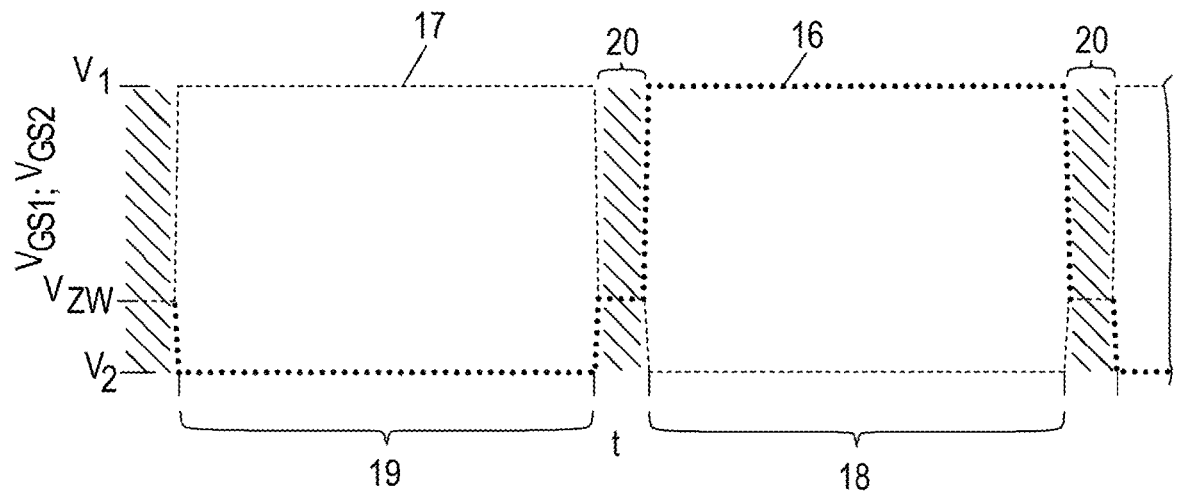
FIG. 4 shows a diagram which illustrates the operation of a half-bridge according to a first exemplary embodiment of the method according to the invention.

A diagram which shows an operation of the electrical circuit 1 according to a first exemplary embodiment of the method according to the invention is illustrated in FIG. 4. In this exemplary embodiment, both the gate-source voltage $V_{GS1}$ of the first transistor representing the first control voltage and the gate-source voltage $V_{GS2}$ representing the second control voltage of the second transistor 4 are set during the dead time state to an intermediate voltage value $V_{ZW}$. This intermediate voltage value $V_{ZW}$ is between the first voltage value $V_1$ and the second voltage value $V_2$. It is possible, for example, that the first voltage value $V_1$ is +15 V and the second voltage value $V_2$ is −4V. In this case, for example, a value of −1 V, 0 V, or 1 V can be selected as the intermediate voltage value $V_{ZW}$. It is also possible that another intermediate value within the interval between the first voltage value $V_1$ and the second voltage value $V_2$ is selected. The setting of the first control voltage and the second control voltage to the intermediate voltage value has the advantage that the respective transistor which is switched to conductive in the operating state following the dead time state has an increased slope during the switching procedure. The switching losses upon switching of the first transistor 3 and/or the second transistor 4 and thus also of the half-bridge 2 of the electrical circuit 1 can thus be reduced. This effect is explained further on the basis of the following diagrams.

Figure 5:
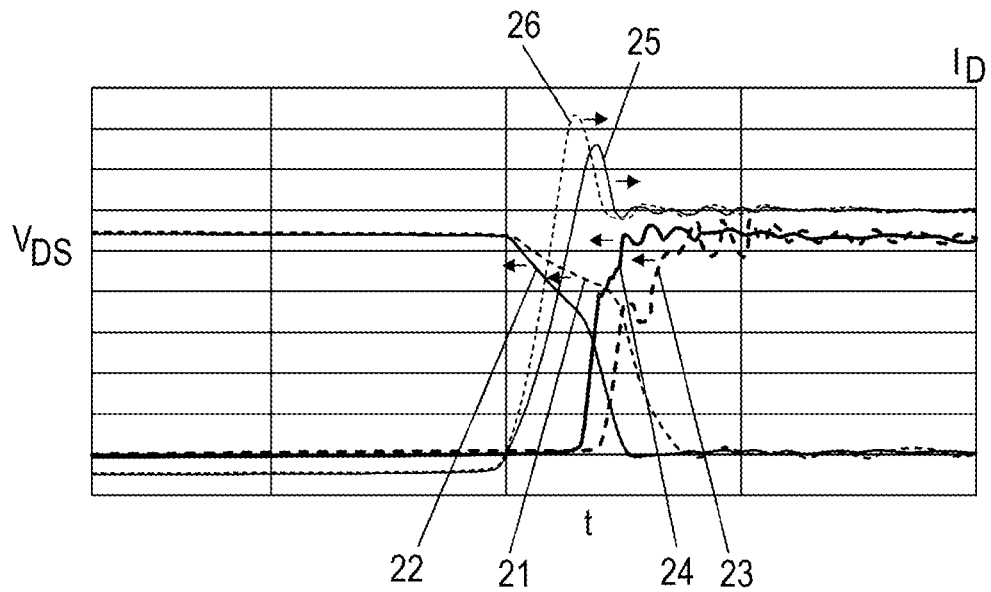
FIG. 5 shows a first diagram which represents the influence of a control voltage set to an intermediate voltage value on a switching-on procedure of a transistor.

FIG. 5 shows a diagram in which the curves 21 and 22 each represent the profile of the drain-source voltage $V_{DS}$ of a transistor of a half-bridge switched to conductive at the end of the dead time state. The curve 21 corresponds here to the case in which the respective control voltage remains during the dead time state at the second voltage value for the transistor switched to nonconductive at the end of the dead time state and the curve 22 corresponds to the case in which the control voltage of the transistor switched to nonconductive is set to an intermediate voltage value during the dead time state. Correspondingly, curves 23 and 24 show the drain-source voltage $V_{DS}$ of the transistor switched to nonconductive at the end of the dead time state, wherein the curve 23 corresponds to the case in which the control voltage of the transistor switched to nonconductive is set to the second voltage value and the curve 24 corresponds to the case in which the control voltage of the transistor switched to nonconductive is set to the intermediate voltage value.

In addition, the drain current which flows through the transistor switched to conductive is illustrated in each of the curves 25 and 26. In this case, the curve 25 represents the drain current for the case in which the control voltage of the transistor switched to nonconductive is set to the second voltage value and the curve 26 corresponds to the case in which the control voltage of the transistor switched to nonconductive is set to the intermediate voltage value. It is apparent that the curve 22 has a greater slope during the switching-on procedure of the transistor than the curve 21. The curve 26 also has a greater slope during the switching-on procedure than the curve 25. It is apparent that the switching characteristic of the switched transistor can be improved and its switching losses can thus advantageously be reduced by the setting of the control voltage to the intermediate voltage value. Studies have shown that the setting of the control voltage to the intermediate voltage value during the switching-on procedure can significantly reduce the switching losses in dependence on a clock frequency of the half-bridge 2.

Figure 6:
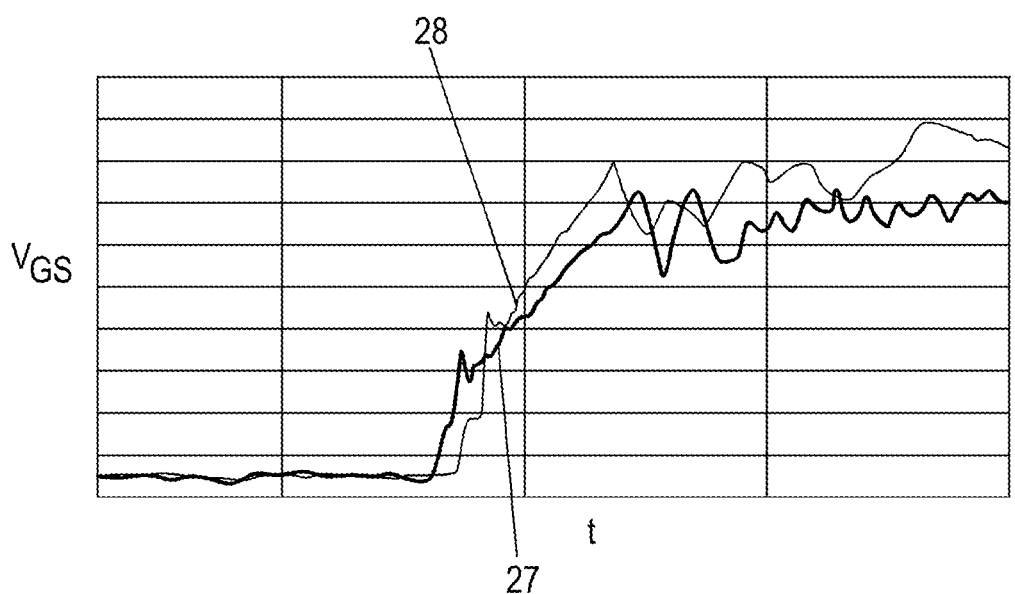
FIG. 6 shows a second diagram which represents the influence of a control voltage set to the intermediate voltage value on a switching-on procedure of a transistor.

The curve of the gate-source voltages of the switched transistor is illustrated in FIG. 6. In this case, curve 27 describes the case in which the control voltage of the non-switched transistor is set to the second voltage value and curve 28 describes the case in which the control voltage of the non-switched transistor is set to the intermediate voltage value. The profiles of the respective measured variables shown in FIGS. 5 and 6 in the curves 21 and 28 relate to the switching-on procedure of a transistor. Studies have shown that the setting of the control voltage to the intermediate voltage value during the switching-off procedure of the transistor also has a positive effect, although it is lesser in comparison to the switching-on procedure.

Figure 7:
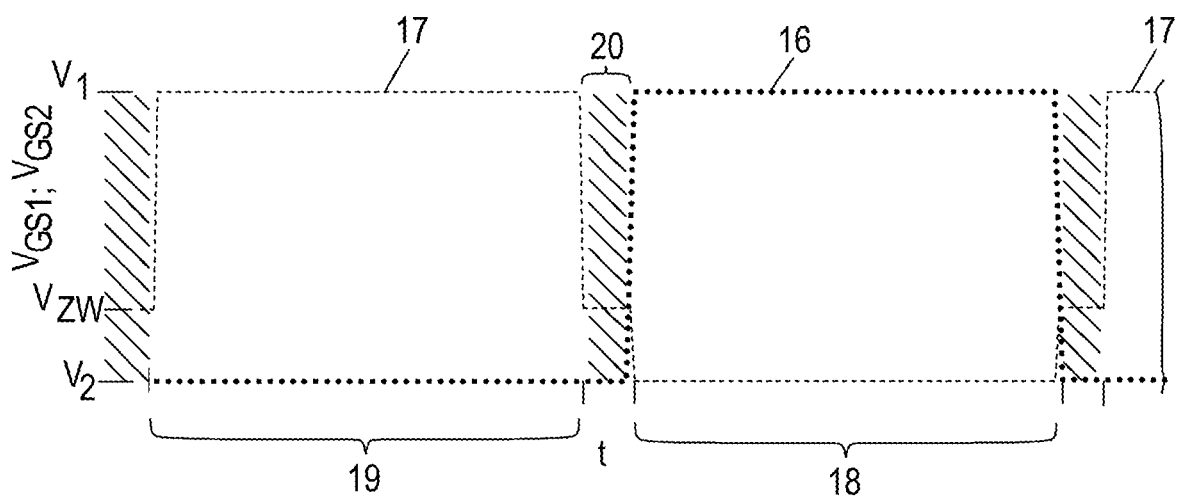
FIG. 7 shows a first diagram, which represents the curve of a first and a second control voltage according to a second exemplary embodiment of the method according to the invention for operating a half-bridge.
Figure 8:
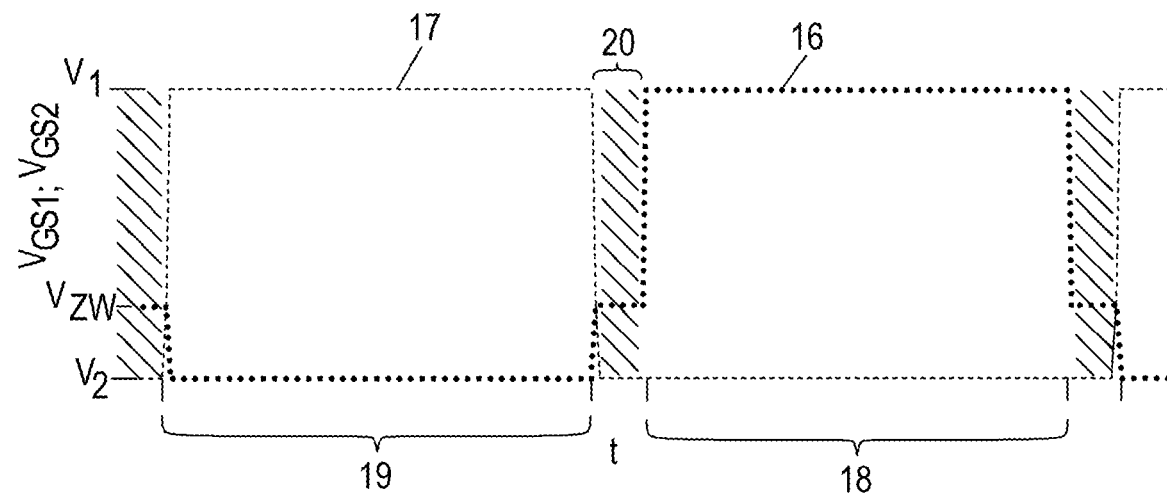
FIG. 8 shows a second diagram, which represents the curve of a first and a second control voltage according to a second exemplary embodiment of the method according to the invention for operating a half-bridge.

In FIG. 7 and FIG. 8, an operation of a half-bridge 2 according to a second exemplary embodiment of a method according to the invention is shown. In this embodiment, it is selected with the aid of the current direction of the load current $I_L$ in relation to the center point 5 of the half-bridge 2 at which of the two transistors 3, 4 the control voltage is set to the intermediate voltage value. In this case, the case for a positive load current is shown in FIG. 7 and the case of a negative load current $I_L$ is shown in FIG. 8. It is obvious that in the case of a positive load current $I_L$, as shown in FIG. 7, the control voltage $V_{GS2}$ of the second transistor 4 plotted in the curve 17 is set in the dead time state located in the region 20 to the intermediate voltage value $V_{ZW}$. The control voltage $V_{GS1}$ of the first transistor 3, which is plotted in curve 16, remains in this dead time state at the second voltage value $V_2$.

As shown in FIG. 8, vice versa, in the case of a negative load current $I_L$ in relation to the center point 5 of the half-bridge 2, the first control voltage $V_{GS1}$ of the first transistor 3 plotted in curve 16 is set to the intermediate voltage value $V_{ZW}$, while in contrast the second control voltage $V_{GS2}$ of the second transistor 4, corresponding to curve 17, remains in the dead time state at the second voltage value $V_2$. A negative load current can occur, for example, in the case of an electrical circuit 1 embodied as a bidirectionally operable, multiphase inverter, which can in particular comprise multiple half-bridges 2.

The consideration of the current direction of the load current $I_L$ enables the respective current-conducting transistor, i.e., in the case shown in FIG. 7, the first transistor 3 representing the high-side transistor of the half-bridge 2, or in the case of a negative load current $I_L$ according to FIG. 8, the second transistor 4 representing the low-side transistor of the half-bridge 2, to be switched using the maximum voltage range between the first voltage value $V_1$ and the second voltage value $V_2$. Such switching of the first transistor 3 and/or the second transistor 4 enables faster operation, which thus has lower switching losses, of the respective transistor.

A determination of the current direction of the load current $I_L$ can be performed, for example, by the current sensor 34 of the electrical circuit 1, which determines the current direction $I_L$ in relation to the center point 5 of the half-bridge 2. It is also possible that a determination of the current direction of the load current $I_L$ is performed via at least one semiconductor sensor associated with at least one of the transistors 3, 4. The at least one semiconductor sensor can be, for example, a component of the control unit 11 here. It is additionally or alternatively also possible that an ascertainment of the current direction of the load current $I_L$ is determined with the aid of a model stored in a processing unit of the electrical circuit 1. The processing unit of the electrical circuit 1 can be, for example, a component of the control unit 11 here, wherein the control unit 11 operates the driver circuits 12, 13 in such a way that they each generate a control voltage ascertained in consideration of the model.

Figure 9:
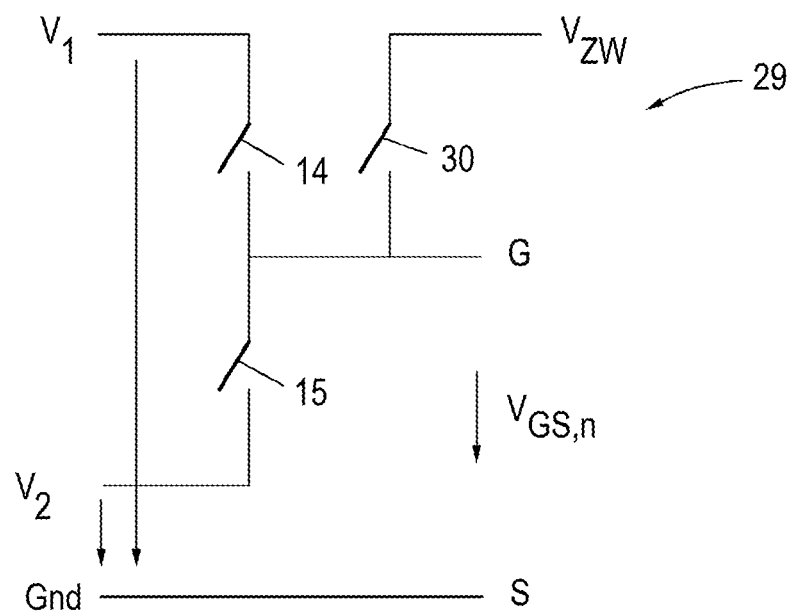
FIG. 9 shows an example of a driver circuit which enables the setting of an intermediate voltage value.

A driver circuit 29 is shown in FIG. 9, which enables the setting of the control voltage of a connected transistor to a first voltage value $V_1$, second voltage value $V_2$ and an intermediate voltage value $V_{ZW}$ lying between these two voltage values. The driver circuit 29 comprises three switches 14, 15, and 30 for this purpose, by means of which the control voltage generated by the driver circuit 29, which can represent a gate-source voltage $V_{GSn}$ of the connected transistor, can be generated. It is also possible in particular that the intermediate voltage value $V_{ZW}$ corresponds to the ground potential GND, wherein it can be provided in this case that the switch 29 is arranged between a gate terminal G of the transistor and the ground potential GND.

Circuit 1 according to the invention can comprise more than one half-bridge 2. It can be provided in particular in this case that each half-bridge 2 of the electrical circuit 1 is activated according to an exemplary embodiment of the method according to the invention. For this purpose, the control unit 11 can comprise, for example, further driver circuits 12, 13, which are each connected to the first transistor and the second transistor of a further half-bridge. It is also possible that a separate control unit 11 is provided for each of the half-bridges. An electrical circuit 1 comprising multiple half-bridges 2 can be implemented, for example, as a three-phase pulse-controlled inverter and in particular can be bidirectionally operable.

Figure 10:
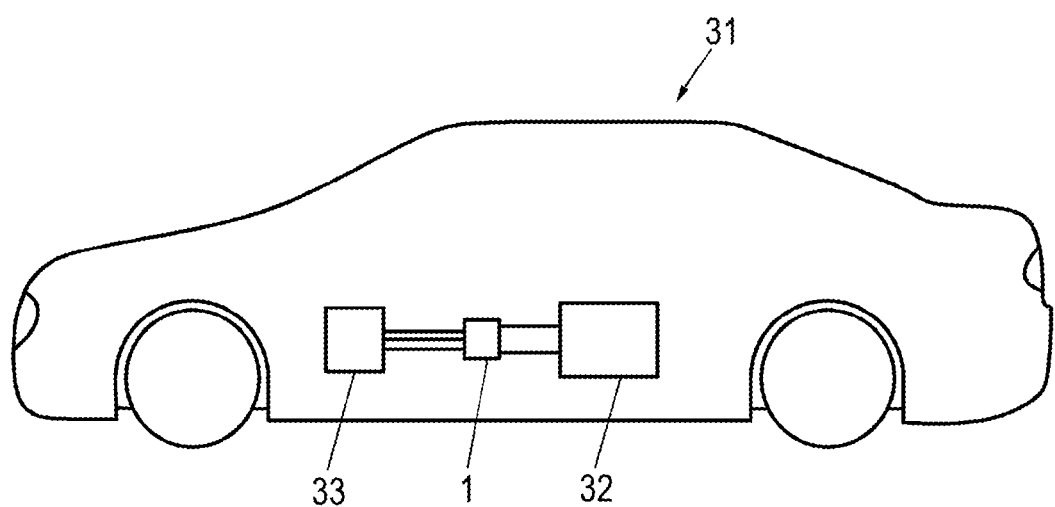
FIG. 10 shows a motor vehicle according to the invention

FIG. 10 shows a motor vehicle 31 according to the invention, which comprises an electrical circuit 1 according to the invention. The electrical circuit 1 is designed as a three-phase traction inverter here and is used to convert a direct current generated by a battery 32 of the motor vehicle 31 into a three-phase alternating current for operating an electric machine 33 of the motor vehicle 32. It can be provided in particular that the electrical circuit 1 is designed for bidirectional operation, so that a rectification of an alternating current generated by the electric machine 33 in a generator mode into a direct current for charging the battery 32 is also possible. Additionally or alternatively, the motor vehicle 31 can comprise at least one further electrical circuit 1, which is, for example, an inverter of the motor vehicle 31 powered from a 12 V vehicle electrical system, a component of an electrical air-conditioning compressor, and/or a DC-DC converter.

The invention claimed is:

1. A method for operating an electrical circuit comprising:
provision of at least one half-bridge, each of which formed from two transistors,
wherein the electrical circuit is switched over between a first switching state, in which a first of the two transistors of the at least one half-bridge is switched to conductive by a first voltage value of a first control voltage and a second of the two transistors of the at least one half-bridge is switched to blocking by a second voltage value of a second control voltage, and a second switching state, in which the first transistor is switched to blocking by a second voltage value of the first control voltage and the second transistor is switched to conductive by a first voltage value of the second control voltage,
wherein a dead time state, in which both transistors are switched to blocking, is assumed chronologically between the first switching state and the second switching state,
wherein, in the dead time state, the control voltage of only one of the two transistors is set to an intermediate voltage value, which is between the first voltage value and the second voltage value, and
wherein, in the dead time state, the selected one of the transistors set to the intermediate voltage value is chosen based on a current direction of a load current flowing at a center point of the at least one half-bridge.

2. The method as claimed in claim 1, wherein the current direction of the load current is predetermined based on a model stored in a processing unit of the electrical circuit.

3. The method as claimed in claim 1, wherein the first transistor is connected to a first potential and the second transistor is connected to a second potential lying below the first potential, wherein, in the dead time state and upon positive current direction of the load current in relation to the center point of the half-bridge, the voltage value of the second control voltage is set to the intermediate voltage value, and wherein, in the dead time state and upon negative current direction of the load current in relation to the center point of the half-bridge, the voltage value of the first control voltage is set to the intermediate voltage value.

4. The method as claimed in claim 1, wherein the current direction of the load current is measured by at least one of a current sensor of the electrical circuit and at least one semiconductor sensor associated with at least one of the transistors.

5. The method as claimed in claim 1, wherein the electrical circuit further comprises a control unit which is configured to generate the first control voltage and/or the second control voltage.

6. The method as claimed in claim 1, wherein field-effect transistors are used as the transistors.

7. The method as claimed in claim 1, wherein an inverter is used as the electrical circuit.

8. An electrical circuit, comprising:

at least one half-bridge, each of which formed from two transistors, and at least one control unit, wherein the at least one control unit is configured to operate the electrical circuit, wherein the electrical circuit is switched over between a first switching state, in which a first of the two transistors of the at least one half-bridge is switched to conductive by a first voltage value of a first control voltage and a second of the two transistors of the at least one half-bridge is switched to blocking by a second voltage value of a second control voltage, and a second switching state, in which the first transistor is switched to blocking by a second voltage value of the first control voltage and the second transistor is switched to conductive by a first voltage value of the second control voltage, wherein a dead time state, in which both transistors are switched to blocking, is assumed chronologically between the first switching state and the second switching state, wherein, in the dead time state, the control voltage of only one of the transistors is set to an intermediate voltage value, which is between the first voltage value and the second voltage value, and wherein, in the dead time state, the selected one of the transistors set to the intermediate voltage value is chosen based on a current direction of a load current flowing at a center point of the at least one half-bridge.

9. The method as claimed in claim 3, wherein the electrical circuit further comprises a control unit which is configured to generate the first control voltage and/or the second control voltage.

10. The method as claimed in claim 4, wherein the electrical circuit further comprises a control unit which is configured to generate the first control voltage and/or the second control voltage.

11. The method as claimed in claim 3, wherein field-effect transistors are used as the transistors.

12. The method as claimed in claim 4, wherein field-effect transistors are used as the transistors.

13. The method as claimed in claim 5, wherein field-effect transistors are used as the transistors.

* * * * *